United States Patent
Clevenger et al.

(10) Patent No.: US 9,634,165 B2
(45) Date of Patent: Apr. 25, 2017

(54) REGENERATION METHOD FOR RESTORING PHOTOVOLTAIC CELL EFFICIENCY

(75) Inventors: Lawrence A. Clevenger, Hopewell Junction, NY (US); Rainer Krause, Mainz (DE); Zhengwen Li, Hopewell Junction, NY (US); Gerd Pfeiffer, Hopewell Junction, NY (US); Kevin Prettyman, Hopewell Junction, NY (US); Brian C. Sapp, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1735 days.

(21) Appl. No.: 12/887,121

(22) Filed: Sep. 21, 2010

(65) Prior Publication Data

US 2011/0100413 A1     May 5, 2011

(30) Foreign Application Priority Data

Nov. 2, 2009 (EP) .................................... 09174792

(51) Int. Cl.
*H01L 31/00* (2006.01)
*H01L 31/042* (2014.01)
(Continued)

(52) U.S. Cl.
CPC ...... *H01L 31/042* (2013.01); *H01L 31/03767* (2013.01); *H01L 31/1864* (2013.01);
(Continued)

(58) Field of Classification Search
USPC .............................. 136/243–293; 438/14, 57
See application file for complete search history.

(56) References Cited

U.S. PATENT DOCUMENTS

| | | | | | |
|---|---|---|---|---|---|
| 3,496,029 | A | * | 2/1970 | King et al. | 438/525 |
| 3,597,281 | A | * | 8/1971 | Fang et al. | 136/245 |

(Continued)

FOREIGN PATENT DOCUMENTS

JP          59-211287       * 11/1984  ............. H01L 31/04

OTHER PUBLICATIONS

Definition of "wafer" from Merriam-Webster, Dictionary, 2 pages.*

(Continued)

*Primary Examiner* — Thanh-Truc Trinh
(74) *Attorney, Agent, or Firm* — Kunzler Law Group

(57) ABSTRACT

An apparatus, system, and method are disclosed for restoring efficiency of a photovoltaic cell. An illumination module illuminates photovoltaic cells so the cells receive a time integrated irradiance equivalent to at least 5 hours of solar illumination. After illumination, an annealing module anneals the photovoltaic cells at a temperature above 90 degrees Celsius for a minimum of 10 minutes. In one embodiment, the illumination module illuminates the photovoltaic cells for a time integrated irradiance equivalent to at least 20 hours of solar illumination. In another embodiment, the illumination module illuminates the photovoltaic cells for a time integrated irradiance equivalent to at least 16 hours of solar illumination while being heated to at least 50 degrees Celsius. In another embodiment, a solar concentrator irradiates the photovoltaic cells in sunlight for at least 10 hours and increases the irradiance of solar illumination on the cells by a factor of 2 to 5.

12 Claims, 7 Drawing Sheets

100 — Illuminate photovoltaic cell such that the time integrated irradiance is equivalent to 5 hours of solar illumination 102 — Anneal photovoltaic cell at a temperature above 90 degrees Celsius for a minimum of 10 minutes

(51) Int. Cl.
*H01L 31/18* (2006.01)
*H01L 31/0376* (2006.01)

(52) U.S. Cl.
CPC .............. *Y02E 10/50* (2013.01); *Y02P 70/521* (2015.11); *Y10T 29/413* (2015.01)

(56) References Cited

U.S. PATENT DOCUMENTS

| | | | |
|---|---|---|---|
| 4,311,870 A | | 1/1982 | Salama |
| 4,547,621 A | * | 10/1985 | Hack et al. .................... 136/249 |
| 4,555,586 A | * | 11/1985 | Guha et al. .................... 136/259 |
| 5,510,271 A | | 4/1996 | Rohatgi et al. |
| 7,071,018 B2 | | 7/2006 | Mason et al. |
| 7,507,903 B2 | | 3/2009 | Luch |
| 2008/0236652 A1 | | 10/2008 | Defries et al. |

OTHER PUBLICATIONS

English translation of JP 59-211287, 1984, 18 pages.*

A. Rohatgi et al., High-efficiency solar cells on edge-defined film-fed grown (18.2%) and string ribbon (17.8%) silicon by rapid thermal processing, Applied Physics Letters, Jan. 5, 2004, pp. 145-147, vol. 84 No. 1.

T. Warabisako et al., Optimization of thermal processing and device design for high-efficiency c-Si solar cells, Solar Energy Materials and Solar Cells, 1997, pp. 137-143, vol. 48 Issue 1.

P. Doshi et al., Rapid Thermal Processing of High-Efficiency Silicon Solar Cells with Controlled In-Situ Annealing, Dec. 5-9, 1994, pp. 1299-1302.

H.E. Elgamel et al., Optimal Surface and Bulk Passivation of High Efficiency Multicrystalline Silicon Solar Cells, Dec. 5-9, 1994, pp. 1323-1326.

Z.T. Kuznicki, A new generation of silicon solar cells with ultrahigh efficiency, Opto-Electronics Review 3-4, 1995, pp. 79-86.

M. Hajji et al., Silicon getteriing: Some novel strategies for performance improvements of silicon solar cells, Journal of Materials Science 40, Photovoltaic Materials and Phenomena Scell, 2004, pp. 1419-1422.

Yan Shao et al., Enhancement of tetracene photovoltaic devices with heat treatment, Applied Physics Letters 90, Oct. 9, 2006.

* cited by examiner

REGENERATION METHOD FOR RESTORING PHOTOVOLTAIC CELL EFFICIENCY

CROSS-REFERENCE TO RELATED APPLICATIONS

This application claims priority to Patent Application Number EP09174792 entitled "REGENERATION METHOD FOR RESTORING PHOTOVOLTAIC CELL EFFICIENCY" and filed on Nov. 2, 2009 for Lawrence A. Clevenger et al., which is incorporated herein by reference.

FIELD

The invention relates to photovoltaic cells, in particular a regeneration method for restoring the efficiency of photovoltaic cells.

BACKGROUND

Description of the Related Art

Photovoltaic modules use a plurality of photovoltaic cells to produce electricity using the photovoltaic effect. Photovoltaic cells may be manufactured in a variety of ways, however the use of semiconductor wafers to manufacture photovoltaic cells or the use of thin semiconductor films deposited upon a substrate are common methods of manufacturing photovoltaic modules. The use of silicon for the semiconductor is also very common A difficulty is that many types of photovoltaic modules experience a decreasing efficiency due to usage.

BRIEF SUMMARY

From the foregoing discussion, it should be apparent that a need exists for an apparatus, system, and method for restoring efficiency of a photovoltaic cell. The present invention has been developed in response to the present state of the art, and in particular, in response to the problems and needs in the art that have not yet been fully solved by currently available photovoltaic cells. Accordingly, the present invention has been developed to provide an apparatus, system, and method for restoring efficiency of a photovoltaic cell that overcome many or all of the above-discussed shortcomings in the art.

An embodiment of the apparatus to restore efficiency of a photovoltaic cell is provided with a plurality of modules configured to functionally execute the necessary steps of illuminating a photovoltaic cell and annealing the photovoltaic cell. These modules in the described embodiments include an illumination module, and an annealing module. The illumination module illuminates one or more photovoltaic cells such that the one or more photovoltaic cells receive a time integrated irradiance equivalent to at least 5 hours of solar illumination. The annealing module anneals the one or more photovoltaic cells at a temperature above 90 degrees Celsius for a minimum of 10 minutes. The annealing is in response to illuminating the one or more photovoltaic cells.

An embodiment of a system of the present invention is also presented. The system may be embodied by a photovoltaic module, a power meter, and a control system. In particular, the system, in one embodiment, includes a photovoltaic module that includes a plurality of photovoltaic cells and a controllable heater for heating the plurality of photovoltaic cells to a temperature of at least 90 degrees Celsius for a minimum of 10 minutes. The plurality of photovoltaic cells are in a manufactured state such that the plurality of photovoltaic cells are capable of producing electricity when illuminated. The power meter measures the performance of the photovoltaic module and the control system controls the controllable heater. The control system is adapted for calculating a regeneration interval based upon the measurement of the performance of the photovoltaic module, and for heating the plurality of photovoltaic cells using the controllable heater to a temperature of at least 90 degrees Celsius for a minimum of 10 minutes in response to expiration of a regeneration interval.

An embodiment of a method of the present invention is also presented for restoring efficiency of a photovoltaic cell. The method in the disclosed embodiments substantially includes the steps necessary to carry out the functions presented above with respect to the operation of the described apparatus and system. In one embodiment, the method includes illuminating a photovoltaic cell such that the photovoltaic cell receives a time integrated irradiance equivalent to at least 5 hours of solar illumination. In another embodiment, the method includes annealing the photovoltaic cell at a temperature above 90 degrees Celsius for a minimum of 10 minutes, the annealing in response to illuminating the photovoltaic cell.

An embodiment of a photovoltaic module of the present system is also presented. The photovoltaic module includes a plurality of photovoltaic cells. The photovoltaic module, in one embodiment, includes a controllable heater for heating the plurality of photovoltaic cells to a temperature of at least 90 degrees Celsius for a minimum of 10 minutes. The plurality of photovoltaic cells are in a manufactured state such that the plurality of photovoltaic cells are capable of producing electricity when illuminated.

Various embodiments of the invention provides for a photovoltaic module, a photovoltaic module system, and a regeneration method for restoring efficiency of a photovoltaic cell in the independent claims. Other embodiments are given in the dependent claims.

Installed photovoltaic modules go through degradation due to various causes like mechanical, thermal, and electrical stress. This degradation causes reduced efficiency of the device. The thermal, electrical and mechanical degradation is highest for thin film photovoltaic ("PV") solar technology based on amorphous silicon layer technology. The aging of such layers are already significant on short time scales. This means that performance degradation of approximately 10% happens already within a time of 1 week.

Embodiments of the invention may recover all or a portion of this degraded performance by annealing the photovoltaic cell.

The invention provides for a regeneration method for restoring efficiency of a photovoltaic cell. A photovoltaic cell as used herein is a device which generates electricity using the photovoltaic effect. Photovoltaic cells are typically manufactured using the p-n junction of a semiconductor material. Photovoltaic cells may be manufactured using thin film technology where thin films of semiconductors are deposited upon a substrate or photovoltaic cells may be manufactured using semiconductor wafers. Doping is used to form the p-n junction. Semiconductor wafers may be a single crystal or polycrystalline. Silicon is the most commonly used material for manufacturing photovoltaic cells. As a photovoltaic cell is used its efficiency will decrease over time. By efficiency it is understood herein that a decrease in efficiency is a decrease in the current and/or voltage produced by a photovoltaic cell for a given illumination.

In one embodiment, the method comprises the step of illuminating the photovoltaic cell such that the photovoltaic cell receives a time integrated irradiance equivalent to at least five hours of solar illumination. Irradiance is the power per unit area of electromagnetic radiation at a surface. The time integrated irradiance is therefore the cumulative power of electromagnetic radiation received by a surface. Solar illumination is defined herein as illumination in the visible spectrum by electromagnetic radiation. It is also understood herein that the irradiance of solar illumination is equivalent to one sun of irradiation. One sun of irradiation is defined to be equivalent to the irradiance of one solar constant. The solar constant is defined as the irradiance of the sun on the outer atmosphere at a distance of 1 astronomical unit.

During the step of illuminating the photovoltaic cell, the photovoltaic cell is burned in or has a decrease in its efficiency through use. Essentially the photovoltaic cell is exposed to sunlight or exposed to artificial light. The method works if the photovoltaic is or is not connected to a load. The method, in one embodiment, further comprises the step of annealing the photovoltaic cell at a temperature above 90 degrees Celsius for a minimum of ten minutes. The annealing process has the effect of restoring or partially restoring the efficiency of the photovoltaic cell. This is advantageous because the efficiency of the photovoltaic cell increases.

In another embodiment the photovoltaic cell comprises a semiconductor wafer. It is understood herein that a semiconductor wafer is a solid wafer of a semiconductor material. It may either be a single crystal or a polycrystalline wafer. Semiconductor wafers used for manufacturing photovoltaic cells are typically silicon however other semiconductor materials may be used also. In another embodiment, the photovoltaic cell receives a time integrated irradiance equivalent to at least 20-30 hours of solar illumination. Performing the annealing process after the equivalent of 20-30 hours of solar illumination is received is advantageous because after about 20-30 hours typically a semiconductor wafer-based photovoltaic cell will have had the largest decrease in its efficiency.

In another embodiment, the photovoltaic cell comprises a semiconductor wafer. The photovoltaic cell receives a time integrated irradiance equivalent to at least 16 hours of solar illumination while being heated to at least 50 degrees Celsius. In this embodiment the aging time may be reduced by heating the photovoltaic cell while exposing it to light. For instance, the solar cells may be aged by exposing them to sunlight while using additional heating. This may accelerate the process by 20% to 30%.

In another embodiment, the photovoltaic cell comprises a semiconductor wafer. In the embodiment, the photovoltaic cell is irradiated in sunlight using a solar concentrator for at least 10 hours. The solar concentrator typically increases the irradiance of solar illumination on the photovoltaic cell by a factor of 2 to 5. This embodiment has the advantage of reducing the 20 to 30 hour aging or burn in time of the photovoltaic cell by about a factor of two. The additional solar illumination causes heating which accelerates the aging process.

In another embodiment the photovoltaic cell is annealed at a temperature above 130 degrees Celsius. The step of annealing the photovoltaic cell further comprises illuminating the photovoltaic cell. This embodiment is advantageous, because at 130 degrees Celsius typically the regeneration of the efficiency of the photovoltaic cell is accelerated. Additionally when the photovoltaic cell is illuminated during this annealing process the efficiency of a photovoltaic cell will typically be restored or partially restored and will not decrease due to illumination again. This embodiment typically applies to photovoltaic cells which comprise a semiconductor wafer.

In another embodiment the annealing of the photovoltaic cell is performed such that the photovoltaic cell receives a time integrated irradiance equivalent to at least ten minutes of solar illumination. This embodiment is advantageous because ten minutes is typically sufficient to recover all or most of the decrease in the efficiency.

In another embodiment the semiconductor wafer is a silicon semiconductor wafer.

In another embodiment the photovoltaic cell is annealed at a temperature between 140 degrees Celsius and 210 degrees Celsius for a minimum of two hours. This embodiment is advantageous because annealing at these temperatures for this duration is typically sufficient to restore the efficiency of most photovoltaic cells.

In another embodiment the photovoltaic cell is a thin film photovoltaic cell. The thin film photovoltaic cell is typically manufactured by depositing a layer or layers of semiconductor material on a substrate. This method is particularly applicable to thin film photovoltaic cells. For thin film photovoltaic cells this regeneration is temporary as the thin film photovoltaic cell is used the efficiency will begin to decrease again. However, this method may be repeated periodically to the thin film photovoltaic cell. This may be considered a so-called maintenance procedure. The photovoltaic cell may be heated using a variety of different means. For instance an infrared absorb material could be used to heat the photovoltaic cell using solar radiation or an external heater may be used to heat the photovoltaic cell.

In another aspect the invention provides for a photovoltaic module. The photovoltaic module comprises a plurality of photovoltaic cells. The photovoltaic module further comprises a controllable heater for heating the plurality of photovoltaic cells to a temperature of at least 90 degrees Celsius for a minimum of ten minutes.

In another embodiment the controllable heater comprises an infrared absorber. The infrared absorber is adapted for moving between a stored position and a deploy position. The infrared absorber is adapted for heating the photovoltaic module using absorbed infrared radiation when in the deployed position.

A variety of materials may be used as an infrared absorber. The spectra of the perovskite titanates, $SrTiO_3$, $PbTiO_3$, and $CaTiO_3$, and the perovskite niobates, $KNbO_3$ and $NaNbO_3$, have been found to be similar, in general features, to that of $BaTiO_3$.

One type of very efficient absorbers of infrared are highly porous metallic films deposited by thermal evaporation in nitrogen. Infrared absorption can also be easy realized by using black colored surfaces or paint. For example a black, metallic surface may be used. This may be realized by a rollable, flexible foil with metalized surface.

In another embodiment the controllable heater comprises any one of the following: an electrical heater, a hot water heater, a solar irradiation concentration device, and a Peltier heater. Any one of these heating means may typically be used to heat the photovoltaic module. The electrical heater, hot water heater, and Peltier heater may be installed on the back or at least behind the photovoltaic cells. A solar radiation concentration device may be mirrors that concentrate solar radiation onto the photovoltaic module.

In another embodiment the photovoltaic cell is annealed at a temperature between 140 degrees Celsius and 210 degrees Celsius for a minimum of two hours. This embodiment is advantageous, because the photovoltaic module comprises a controllable heater which is able to perform an anneal which regenerates the efficiency of the photovoltaic cells which make up the photovoltaic module.

In another aspect the invention provides for a photovoltaic module system. The photovoltaic module system comprises a photovoltaic module according to an embodiment of the invention. The photovoltaic module system comprises a parameter for measuring the performance of the photovoltaic module. The photovoltaic module system comprises a control system for controlling the controllable heater. The control system is adapted for calculating a regeneration interval based upon the measurement of the performance of the photovoltaic module. This embodiment is advantageous because the control system can automatically control the controllable heater such that the efficiency of the photovoltaic module is optimized. When the photovoltaic module is heated its efficiency will decrease or else it may possibly be covered by an infrared absorber in which case the photovoltaic module would not generate electricity. It is therefore beneficial to have a control system which can optimize when the regeneration of the photovoltaic cell is performed.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter.

BRIEF DESCRIPTION OF THE DRAWINGS

In the following, preferred embodiments of the invention will be described in greater detail by way of example only making reference to the drawings in which.

DETAILED DESCRIPTION

Figure 1:
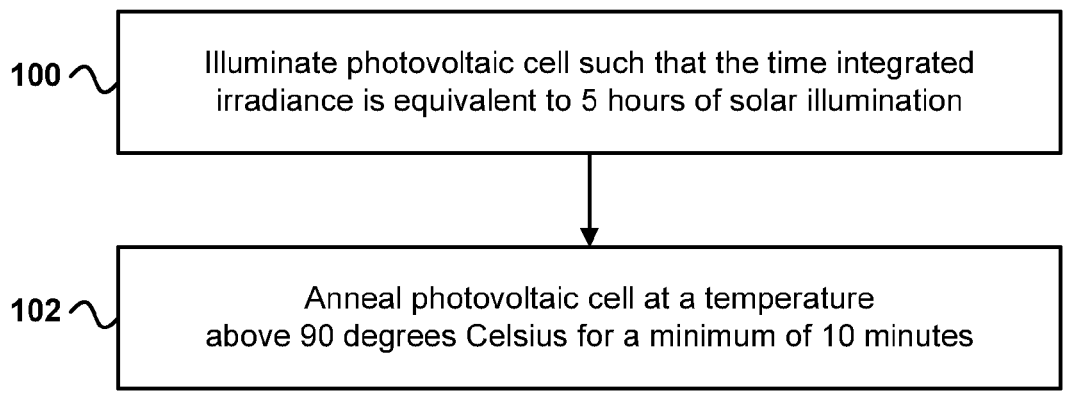
FIG. 1 shows a block diagram which illustrates an embodiment of a method according to the invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, may be at least partially implemented by computer readable program code. These computer readable program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The computer readable program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

In the following, like numbered elements in these figures are either similar elements or perform an equivalent function. Elements which have been discussed previously will not necessarily be discussed in later figures if the function is equivalent.

FIG. 1 shows a block diagram illustrating an embodiment of a method according to the invention. In step 100 a photovoltaic cell is illuminated such that the time integrated irradiance it receives from a light source is equivalent to five hours of solar illumination. In step 102 the photovoltaic cell is annealed at a temperature above 90 degrees Celsius for a minimum of ten minutes.

Figure 2:
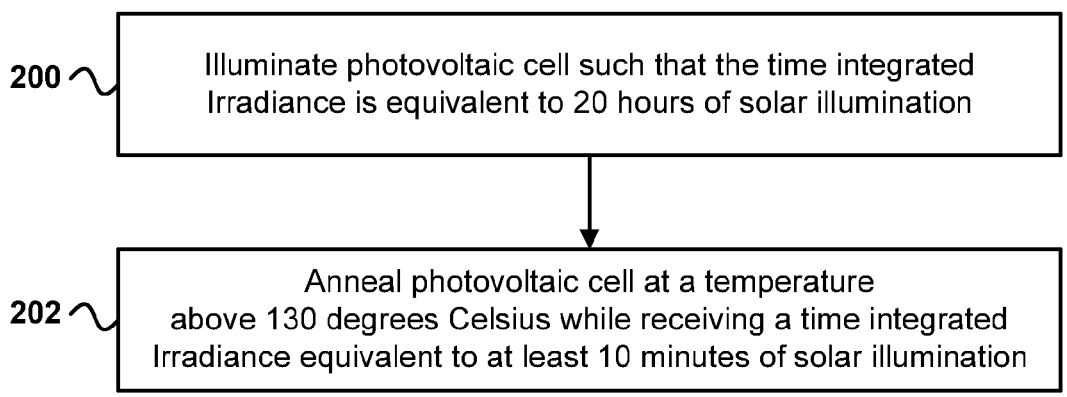
FIG. 2 shows a block diagram which illustrates a further embodiment of a method according to the invention.

FIG. 2 shows a block diagram and illustrates a regeneration method for restoring the efficiency of a photovoltaic cell according to a further embodiment of the invention. In step 200 a photovoltaic cell is illuminated such that the time integrated irradiance it receives from a light source is equivalent to 20-30 hours of solar illumination. The 20-30 hours of equivalent solar illumination is equivalent to the amount of time for which a photovoltaic cell made from a semiconductor wafer will experience the majority of its efficiency decrease. This 20-30 hour period of time may be considered a burn in time.

In step 202 the photovoltaic cell is annealed at a temperature above 130 degrees Celsius while receiving a time integrated irradiance equivalent to at least ten minutes of solar illumination. This is advantageous, because a semiconductor wafer photovoltaic cell will recover most or all of its lost efficiency during this annealing time. If the photovoltaic cell is exposed to illumination as equivalent to solar illumination then the efficiency of the solar cell typically will not decrease again when it is exposed to further illumination. This process may be performed on individual photovoltaic cells, or it may be performed on entire photovoltaic modules.

Figure 3:
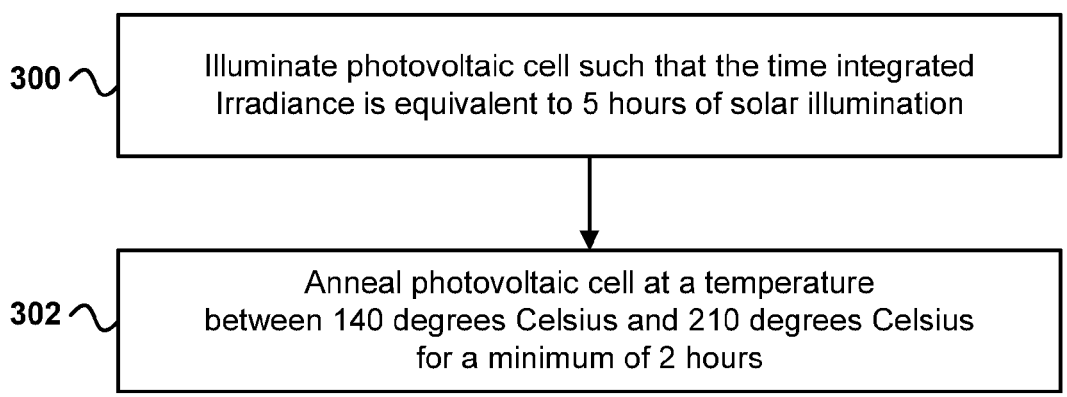
FIG. 3 shows a block diagram which illustrates a further embodiment of a method according to the invention.

FIG. 3 shows a block diagram which illustrates a further embodiment of a regeneration method for restoring the efficiency of a photovoltaic cell. In step 300 a photovoltaic cell is illuminated such that the time integrated irradiance it receives from the light source is equivalent to five hours of solar illumination. In step 303 the photovoltaic cell is annealed at a temperature between 140 degrees Celsius and 210 degrees Celsius for a minimum of two hours.

In this embodiment, the photovoltaic cell is healed by applying a temperature of greater than 90 degrees Celsius. This embodiment of the regeneration method functions well when the photovoltaic cell is annealed at a temperature between 150 degrees Celsius and 210 degrees Celsius for several hours. The duration of the anneal could be approximately three hours.

Possible methods of heating the photovoltaic cell include using:
  Infrared absorber layer which goes for the healing time on the front;
  Electrical heating from back using electrical power (could be also done after sun hours), also a Peltier system can be used;
  Concentration device which goes during healing on top of the module; and
  Hot water heating, possible through thermal solar attachment.
  Or combined out of the listed solutions above This embodiment of the invention is most efficient for thin film based photovoltaic cells, for instance amorphous Silicon modules. However, this embodiment is also applicable to older semiconductor wafer based modules too.

Figure 4:
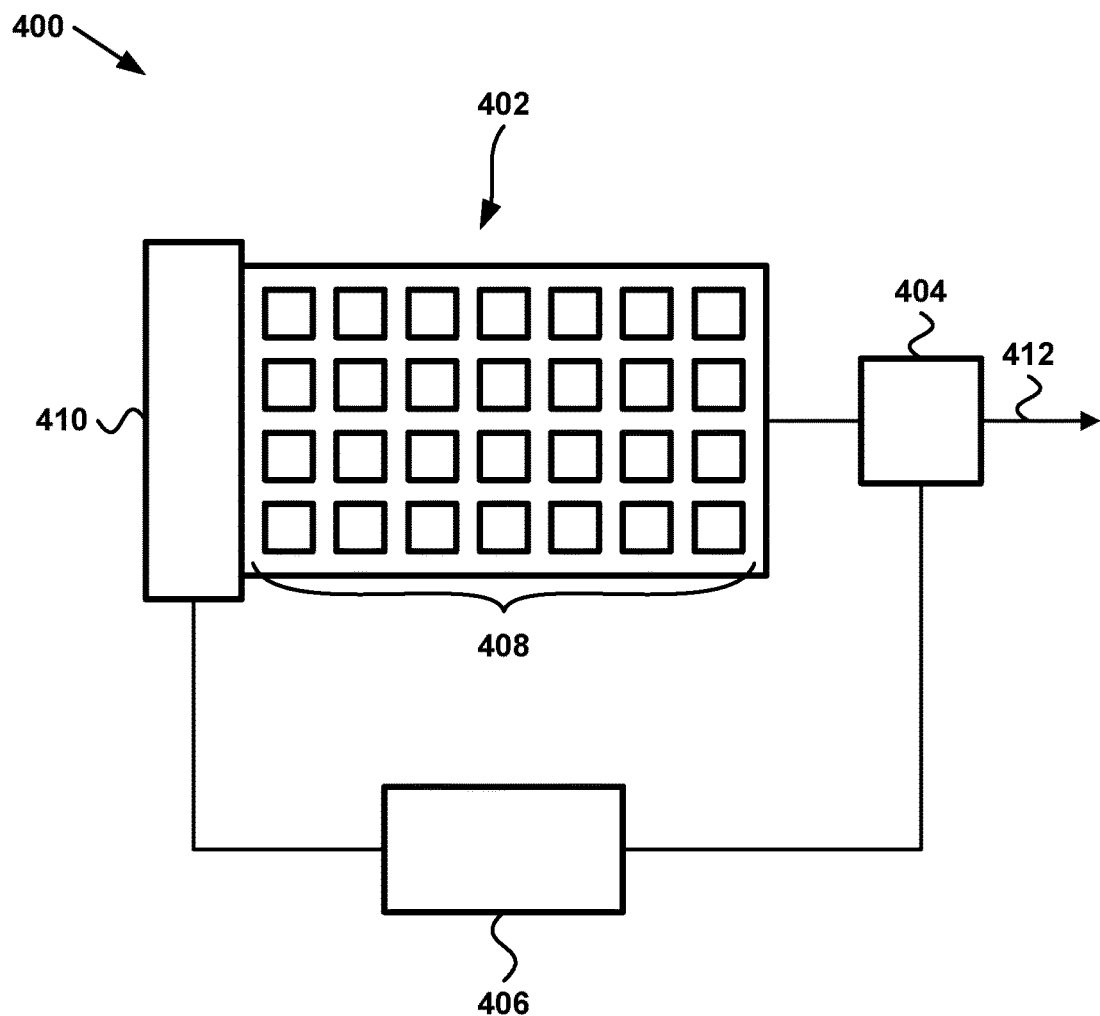
FIG. 4 illustrates an embodiment of a photovoltaic module system according to an embodiment of the invention.

FIG. 4 shows a photovoltaic module system 400 according to an embodiment of the invention. In FIG. 4 there is a photovoltaic module 402 which is connected to a power meter 404. The power meter 404 has a connection to an inverter, batteries, etc. 412. The power meter 404 may also be integrated into the power system, inverter, or batteries of a photovoltaic power system. Power meter 404 is connected to a control system 406 which is adapted for receiving information about the power output of the photovoltaic module 402. The control system 406 is adapted for controlling the controllable heater 410. The controllable heater is shown as being a component of the photovoltaic module 402.

The controllable heater may be implemented in a variety of ways. It may be a heater on the back of the photovoltaic module 402 or the controllable heater 410 may also be an infrared absorber which goes in front of the photovoltaic module 402 and uses solar illumination to increase the temperature of the photovoltaic module 402. The photovoltaic module 402 has a plurality of photovoltaic cells 408 which are connected together and used to create electrical power. The control system may be a microcontroller, an embedded system, a computer, a computer system, or a programmable controller. The control system 406 is adapted for calculating the optimal time to engage the controllable heater 410.

Heating the photovoltaic module 402 to regenerate its efficiency typically increases the output of electrical power by the photovoltaic module, however during this time the photovoltaic module may not be able to produce any electricity or may have the amount of electricity it produces greatly reduced due to the increased temperature. Therefore it may be necessary to optimize when the efficiency of the photovoltaic cells 408 of the photovoltaic module 402 are regenerated.

Figure 5:
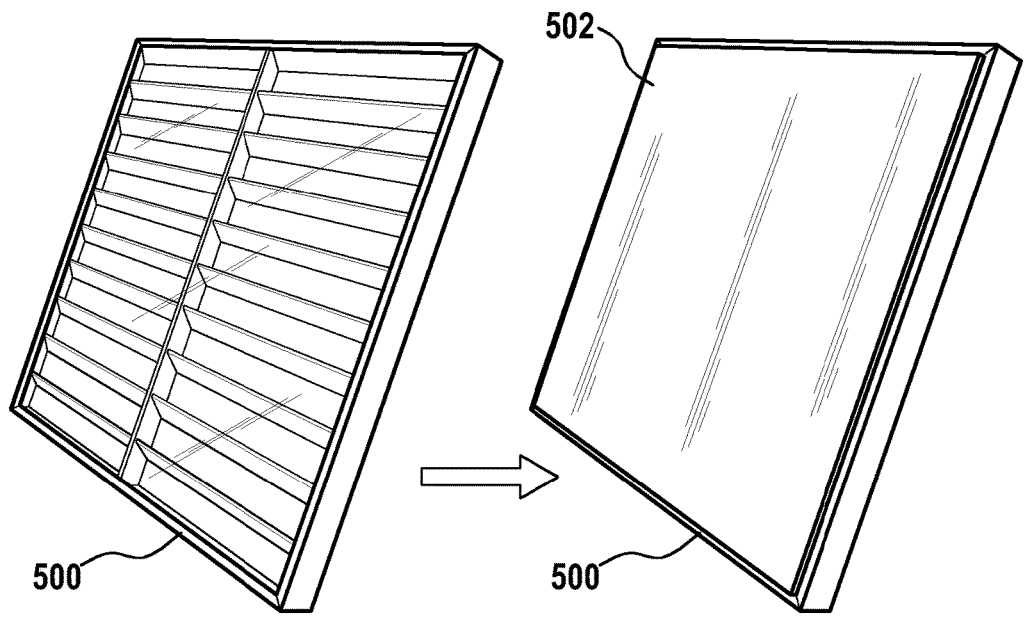
FIG. 5 illustrates an embodiment of a photovoltaic module according to an embodiment of the invention.

FIG. 5 shows a perspective drawing of a photovoltaic module 500. View 502 shows the same photovoltaic module with an infrared absorber 502 that is deployed. This infrared absorber could be rolled out over the surface of the photovoltaic module 500. This embodiment has a specific flexible layer which acts like a infrared absorber. This absorber uses the infrared part of the sunlight to heat the photovoltaic module. Regular off the shelf infrared absorber material may be used. For example, polymer patterned or dark painted surfaces with metalized back surface for better heat transfer may be used. The heat on the absorber medium is used to heat the photovoltaic cells of the photovoltaic module.

Figure 6:
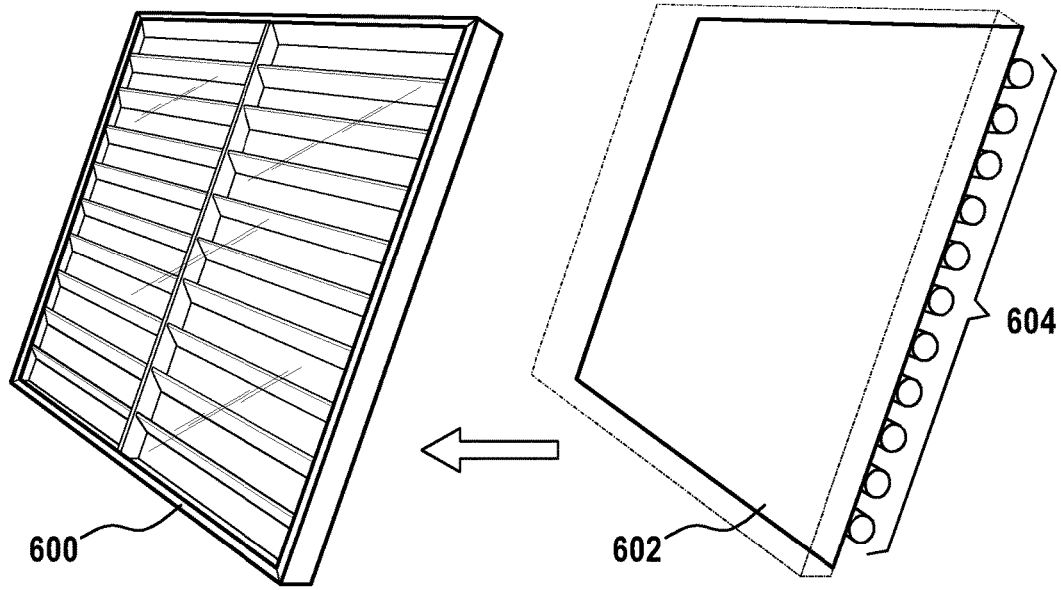
FIG. 6 illustrates a further embodiment of a photovoltaic module according to an embodiment of the invention.

FIG. 6 shows a perspective drawing of a photovoltaic module 600. The surface labeled 602 represents the back surface of the photovoltaic module 600. Heating elements 604 are shown as being mounted on the back surface 602 of the photovoltaic module 600. These heating elements could for example be heat pipes for carrying hot water or heating elements for electrically heating the photovoltaic module 600.

Figure 7:
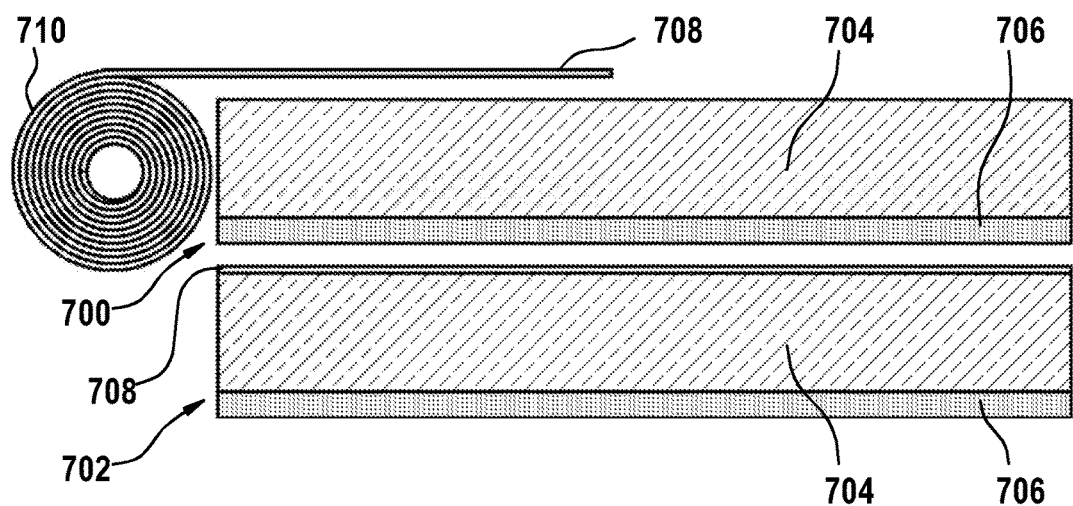
FIG. 7 illustrates a further embodiment of a photovoltaic module according to an embodiment of the invention.

FIG. 7 shows a photovoltaic module 700 with an infrared absorber partially deployed and the same photovoltaic module 702 with the infrared absorber deployed. The photovoltaic module comprises a glass substrate 704 which is over and protects a plurality 706 of photovoltaic cells.

The photovoltaic cells may be individual wafers or the photovoltaic cells may have been deposited upon a substrate using thin film deposition techniques. Often when a photovoltaic module is manufactured using thin film techniques regions of the photovoltaic module are partitioned into individual photovoltaic cells. This can be achieved by pattering and it may also be achieved by burning material away using a laser. In view 700 the infrared absorber is shown as being partially deployed. A portion of the infrared absorber 708 is spooled 710. The infrared absorber may be guided by wires and guides as it is deployed. In view 702 the infrared absorber 708 is shown as covering the surface of the photovoltaic module 702.

FIG. 7 is used to illustrate how an infrared absorber 708 could be mechanically extended or retracted along the surface of a photovoltaic module. Guide rails or guard wires, which are not shown, may be used to guide the infrared absorbing foil across the surface of the photovoltaic module 700, 702.

Figure 8:
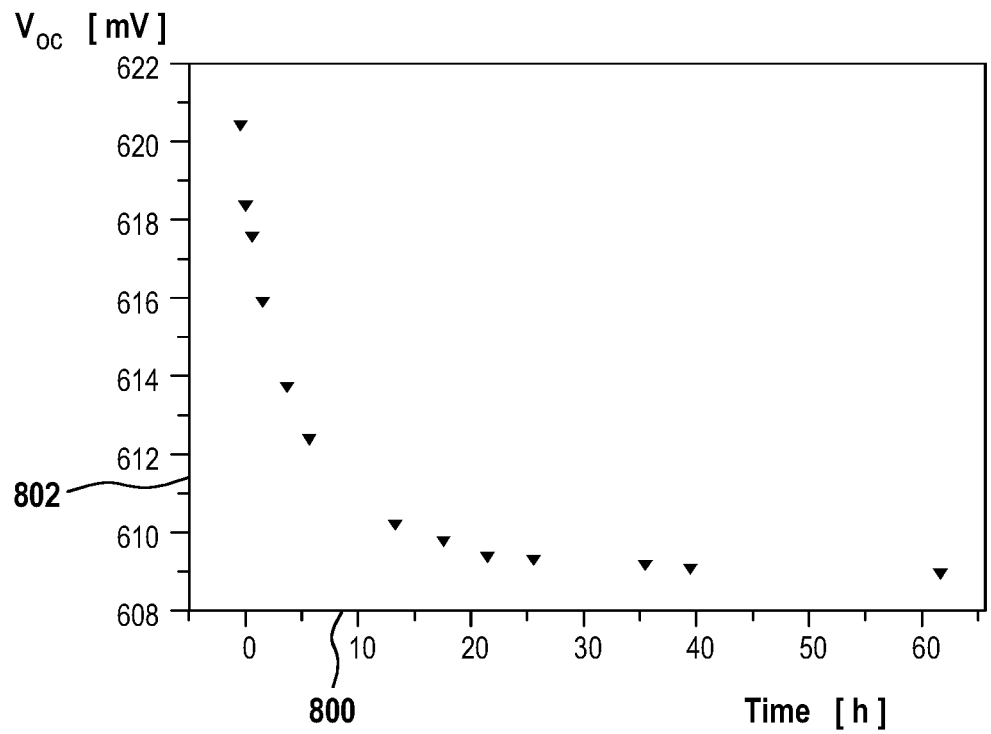
FIG. 8 shows a plot which illustrates the decrease in efficiency of a wafer-based photovoltaic cell made of crystalline silicon.

FIG. 8 shows a plot which illustrates the decrease in efficiency of a wafer-based photovoltaic cell made of crystalline silicon. The x axis is labeled 800 and this is the time of illumination by a one sun equivalent. As on the y axis is labeled 802 and shows the open circuit voltage of the photovoltaic cell measured in mV. This figure illustrates that in the first 20 hours of operation the efficiency of the photovoltaic cell drastically decreases.

Efficiency decays for a photovoltaic cell under illumination may be substantial during the first 20 to 30 hours of exposure to sunlight. Stabilization for the end user can be improved by applying an aging or burn in of the cell at the end of the manufacturing line. This can be also performed on module level.

Photovoltaic cells may be treated in an aging chamber, after production, using artificial light or sunlight. The degraded performance can now be recovered using thermal treatment during light exposure, to accelerate aging. Degradation typically is in the range of 2% to 3% of the open circuit voltage (VOC) of the photovoltaic cell. FIG. 8 shows a typical degradation curve for the first 60 hours, of a crystalline silicon cell.

Figure 9:
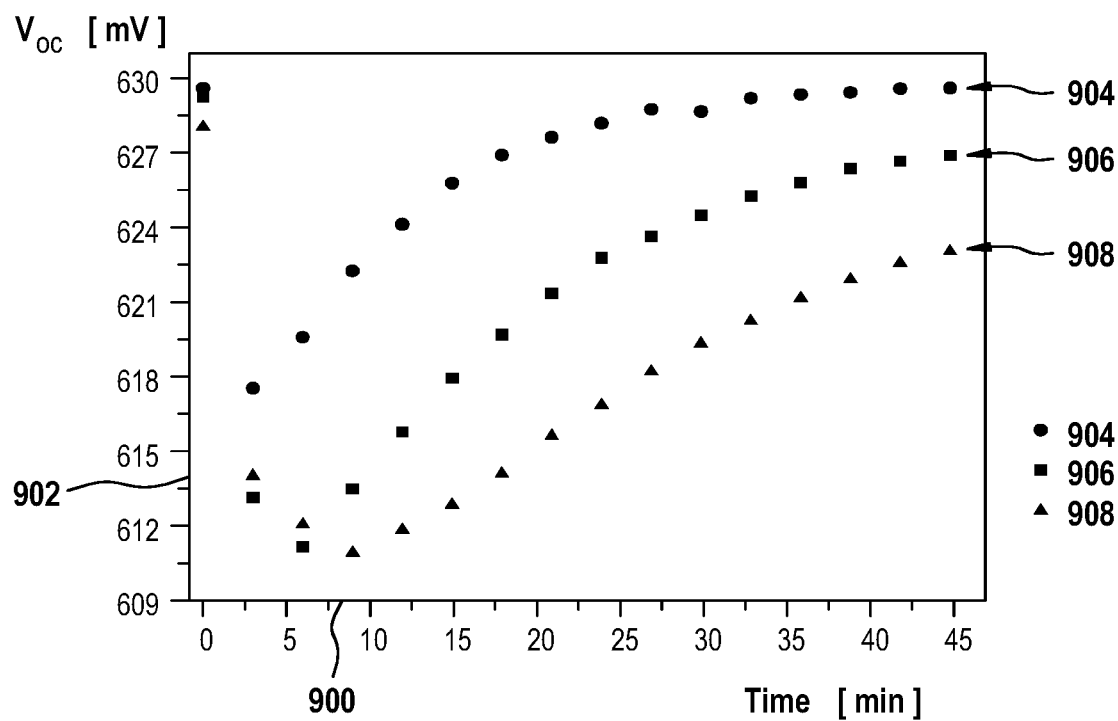
FIG. 9 shows a plot which illustrates the regeneration of a photovoltaic cell that is annealed at 140 degrees Celsius at various illumination intensities.

FIG. 9 shows the regeneration of a photovoltaic cell that is annealed at 140 degrees Celsius at various illumination intensities. The x axis 900 is the time. The y axis is the open circuit voltage 902 of the photovoltaic cell. Three different illumination intensities are shown. The curve with the points labeled 904 shows the open circuit voltage 902 for one sun of illumination. The curve with the points labeled 906 shows the open circuit voltage 906 for a third of a sun of illumination. Finally in the curve at the points labeled 908 the open circuit voltage is shown when the illumination is equivalent to one ninth of a sun. In FIG. 9 we see that as the time increases the efficiency of the photovoltaic cell is gradually restored. Also evident in FIG. 9 is that the intensity of the light increases how rapidly the photovoltaic cell is restored.

Complete reversal to original state may be achieved for a semiconductor wafer photovoltaic cell by annealing at 200 degrees Celsius for 10 minutes in the dark.

FIG. 9 illustrates that from the degraded efficiency state, illumination at elevated temperature (140 degrees Celsius) recovers the efficiency. This figure also illustrates that the regeneration of the photovoltaic cell can be accelerated using higher light intensity during the anneal.

Figure 10:
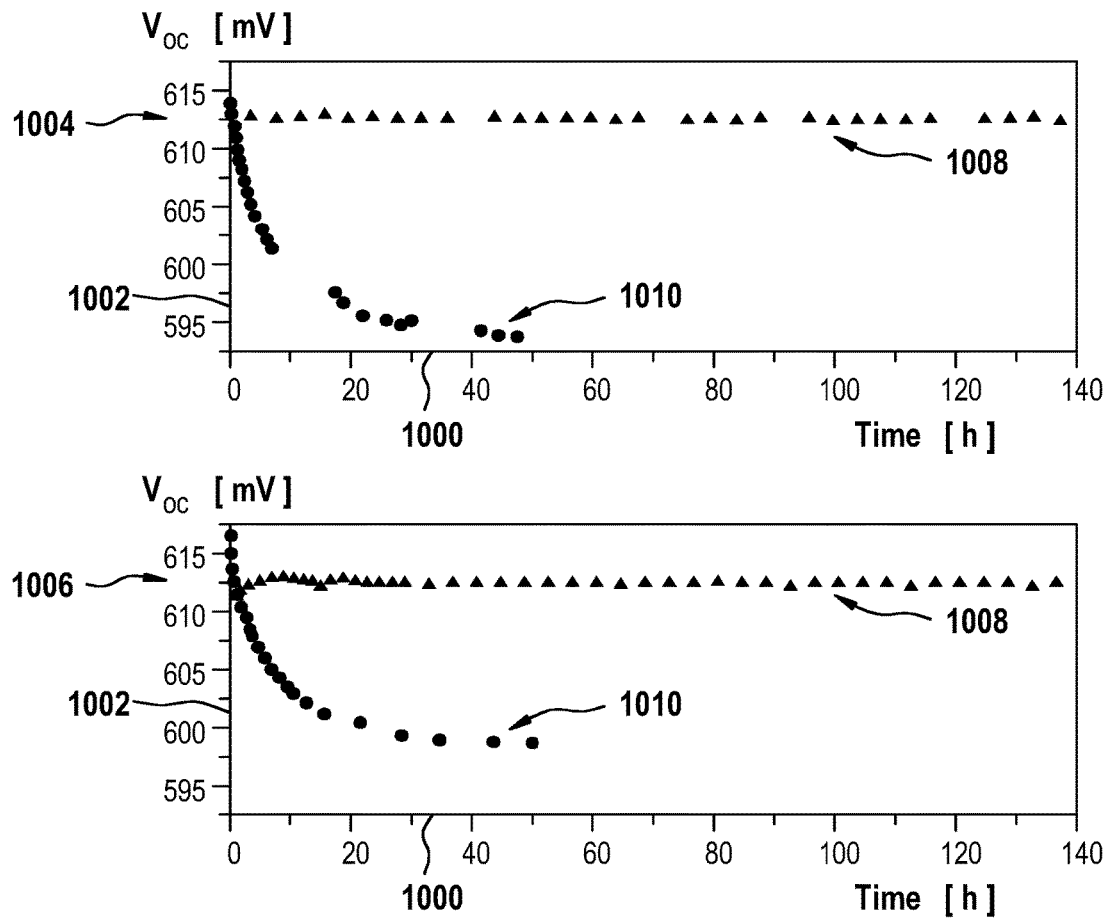
FIG. 10 shows a plot which illustrates that when a photovoltaic cell comprising a semiconductor wafer is annealed under illumination that the efficiency becomes stable.

However, the state produced via annealing and illumination is stable and does no longer degrade, as demonstrated in FIG. 10. FIG. 10 shows a comparison between annealed cells and cells which had been illuminated during regeneration. The degradation was here induced through illumination.

FIG. 10 illustrates that when a photovoltaic cell comprising a semiconductor wafer is annealed under illumination that the efficiency becomes stable and no longer degrades. FIG. 10 shows photovoltaic cells which had been annealed and exposed to illumination 1008 and photovoltaic cells which had only been annealed 1010. The x axis is labeled as 1000 and the open circuit voltage is labeled on the y axis as 1002. The open circuit voltage is given in mV and the time is given in hours. There are two graphs shown. Graph 1004 shows the open circuit voltage performance of the cells at one cell of illumination. Chart 1006 shows the open circuit voltage performance of the cells with an applied forward bias of 0.5 volts. Both sets of measurements were taken at 25 degrees Celsius.

The burn in can be applied right after the cells are finished. This can be in an illumination chamber or even using direct sun light in an open environment. The cells or modules are exposed to the light up to 30 hours. In one embodiment, acceleration of the aging can be achieved through additional heating or slight sun light concentration at a concentration level of 2 times up to 5 times. After this, the regeneration process is used to recover the original efficiency. This is performed using an elevated temperature in a chamber while applying a 1 sun illumination to the devices.

Figure 11:
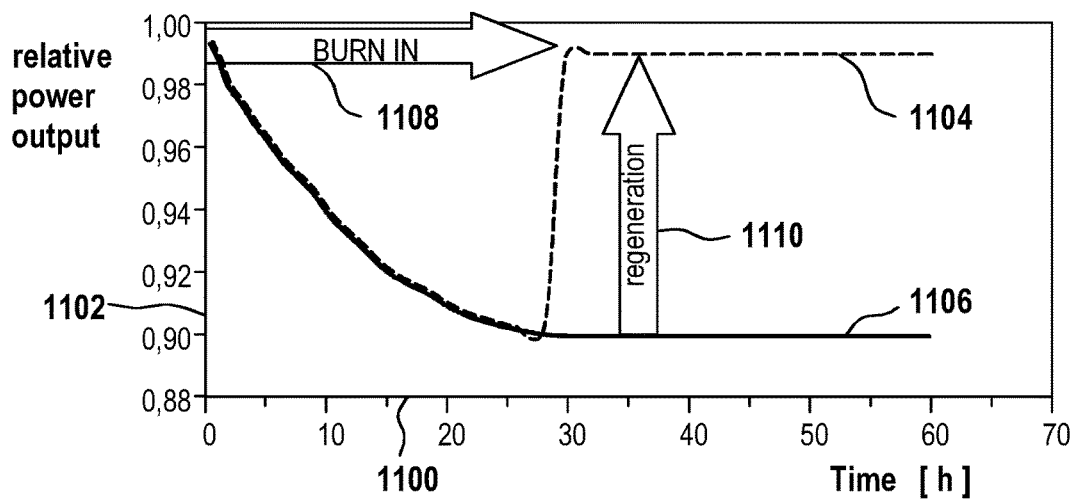
FIG. 11 shows a plot which illustrates the burn in and regeneration process for photovoltaic cells which comprise a semiconductor wafer.

FIG. 11 illustrates the burn in and regeneration process for photovoltaic cells which comprise a semiconductor wafer. The x axis 1100 is the time in hours, axis 1102 is the relative power output in arbitrary units. The relative power output is in comparison to a newly manufactured photovoltaic cell. Relative power output therefore represents the decrease in efficiency relative to a newly manufactured photovoltaic cell. Curve 1106 shows the efficiency of a photovoltaic cell under one sun of illumination as the time increases. Curve 1104 shows the relative power output of a photovoltaic cell which is annealed and exposed to illumination at a time of 30 hours. Arrow 1108 represents the burn in time of the photovoltaic cell. Arrow 1110 shows the increase in efficiency caused by using the regeneration method.

Figure 12:
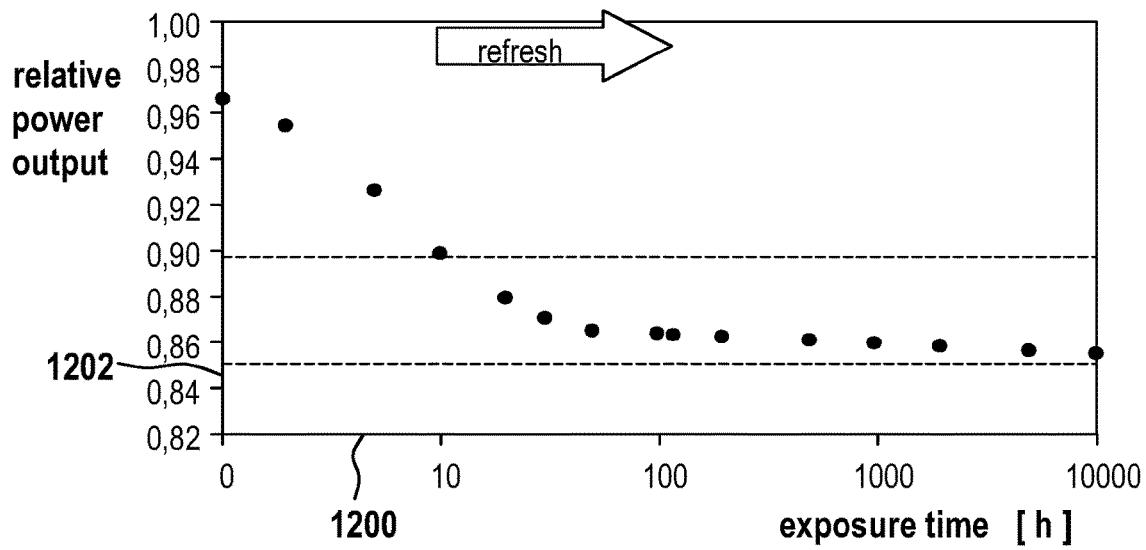
FIG. 12 shows a plot which illustrates the decrease in efficiency for a thin film or amorphous silicon photovoltaic cell.

FIG. 12 shows the decrease in efficiency for a thin film or amorphous silicon photovoltaic cell. The x axis is the exposure time in hours and is labeled 1200. The y axis is labeled 1202 and is the relative power output. This figure illustrates that over use, the power output of amorphous silicon photovoltaic cells decreases by approximately 15%.

Using the data above, we can determine the improvement using a refresh cycle running every 30 hours. The refresh cycle in this case would be the healing anneal. This is only an example; the refresh cycle could be also shorter to increase the power output.

Figure 13:
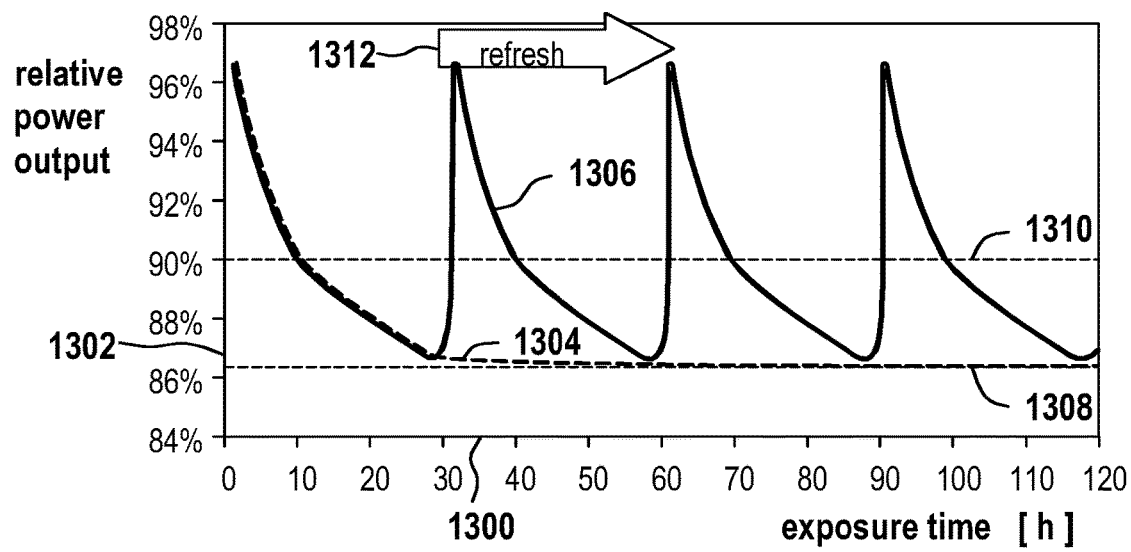
FIG. 13 shows an illustration of how the relative power output of an amorphous silicon photovoltaic cell can be increased using an embodiment of the regeneration method.

FIG. 13 illustrates how the relative power output of an amorphous silicon photovoltaic cell can be increased using an embodiment of the regeneration method. The x axis 1300 labels the exposure time in hours. The y axis 1302 is the relative power output. Curve 1304 shows the relative power output of an amorphous silicon photovoltaic cell which is not regenerated. The dashed line 1308 indicates the average relative power output of the photovoltaic cell which is not regenerated. The line labeled 1306 shows the relative power output for a photovoltaic cell which is regenerated periodically. The dashed line 1310 indicates the average relative power output for the photovoltaic cell that is regenerated periodically. In this figure we see that the relative power output has been increased from about 86.5% to a little over 90%. This results in a substantial increase in the generation of power over the lifetime of the photovoltaic module. The arrow labeled 1312 indicates the regeneration time. The regeneration time in this example is 30 hours of use.

The improved power output for the 30 hour cycle is at around 4% (cf. line 1319 and line 1308). At a 20 hour recycle loop the gain would be 6% and at 10 hours it is 8%.

This examples show significant improvement potentials for aging compensation using an anneal to restore the efficiency of a thin film photovoltaic cell.

LIST OF REFERENCE NUMERALS

400 photovoltaic module system
402 photovoltaic module
404 power meter
406 control system
408 photovoltaic cells
410 controllable heater
412 connection to inverter or batteries
500 photovoltaic module
502 infrared absorber
600 photovoltaic module
602 back surface of photovoltaic module
604 heat pipes or electrical heating
700 photovoltaic module with infrared absorber partially deployed
702 photovoltaic module with infrared absorber deployed
704 glass substrate
706 plurality of photovoltaic cells
708 infrared absorber
710 spooled infrared absorber
800 time in minutes
802 open circuit voltage in mV
900 time in minutes
902 open circuit voltage in mV
904 one sun of illumination
906 ⅓ sun of illumination
908 ⅛ sun of illumination
1000 time in hours
1102 open circuit voltage in mV
1104 open circuit voltage at one sun of illumination
1106 open circuit voltage at one sun of illumination with a forward voltage bias of 0.5 Volts
1008 annealed under illumination
1010 annealed without illumination
1100 time in hours
1102 relative power output
1104 efficiency when illuminated and annealed
1106 efficiency without annealing
1108 burn in time
1110 increase in efficiency
1200 time in hours
1202 relative power output
1300 time in hours
1302 relative power output
1304 relative power output without regeneration
1306 relative power output with regeneration
1308 average relative power output without regeneration
1310 average relative power output with regeneration
1312 regeneration time The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   illuminating, during a manufacturing process, a photovoltaic cell to receive a time integrated irradiance, such that the cumulative power of electromagnetic radiation received by the photovoltaic cell is equivalent to at least 5 hours of solar illumination; and
   annealing, during the manufacturing process, the photovoltaic cell at a temperature above 90 degrees Celsius for a minimum of 10 minutes, wherein annealing the photovoltaic cell further comprises illuminating the photovoltaic cell during the annealing, the annealing in response to illuminating the photovoltaic cell.

2. The method of claim 1, wherein the photovoltaic cell receiving a time integrated irradiance equivalent to at least 5 hours of solar illumination comprises one of:
the photovoltaic cell receiving a time integrated irradiance equivalent to at least 20 hours of solar illumination;
the photovoltaic cell receiving a time integrated irradiance equivalent to at least 16 hours of solar illumination while being heated to at least 50 degrees Celsius; and
the photovoltaic cell being irradiated in sunlight using a solar concentrator for at least 10 hours, and wherein the solar concentrator increases the irradiance of solar illumination on the photovoltaic cell by a factor of 2 to 5.

3. The method of claim 2, wherein annealing the photovoltaic cell at a temperature above 90 degrees Celsius for a minimum of 10 minutes comprises annealing the photovoltaic cell at a temperature above 130 degrees Celsius.

4. The method of claim 1, wherein illuminating the photovoltaic cell during the annealing of the photovoltaic cell is performed such that the photovoltaic cell receives a time integrated irradiance equivalent to at least 10 minutes of solar illumination during annealing.

5. The method of claim 1, wherein the semiconductor wafer is a silicon semiconductor wafer.

6. The method of claim 1, wherein annealing the photovoltaic cell at a temperature above 90 degrees Celsius for a minimum of 10 minutes comprises annealing the photovoltaic cell at a temperature between 140 degrees Celsius and 210 degrees Celsius for a minimum of 2 hours.

7. The method of claim 1, wherein the photovoltaic cell is illuminated at the end of a manufacturing process of the photovoltaic cell such that the photovoltaic cell produces electricity when illuminated.

8. The method of claim 1, wherein the photovoltaic cell is illuminated with a light source that simulates light from the sun.

9. The apparatus of claim 1, wherein the photovoltaic cell receiving a time integrated irradiance equivalent to at least 5 hours of solar illumination comprises the photovoltaic cell receiving a time integrated irradiance equivalent to at least 20 hours of solar illumination and wherein annealing the photovoltaic cell at a temperature above 90 degrees Celsius for a minimum of 10 minutes comprises annealing the photovoltaic cell at a temperature between 140 degrees Celsius and 210 degrees Celsius.

10. The apparatus of claim 9, wherein illuminating the photovoltaic cell during annealing further comprises the photovoltaic cell receiving an irradiance equivalent to 1 sun for at least 20 minutes.

11. The apparatus of claim 1, wherein the photovoltaic cell comprises a semiconductor wafer.

12. The apparatus of claim 11, wherein the semiconductor wafer comprises one of a single crystal wafer and a polycrystalline wafer.

\* \* \* \* \*